(12) United States Patent
Kim

(10) Patent No.: US 6,489,212 B1
(45) Date of Patent: *Dec. 3, 2002

(54) SEMICONDUCTOR DEVICE AND METHOD FOR FABRICATING THE SAME

(75) Inventor: Yong Chan Kim, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 09/532,155

(22) Filed: Mar. 21, 2000

(30) Foreign Application Priority Data

Apr. 2, 1999 (KR) .............................................. 99-11611

(51) Int. Cl.$^7$ ............................................ H01L 21/331
(52) U.S. Cl. ...................................... 438/357; 438/341

(58) Field of Search .................................. 438/316, 325, 438/335, 341, 370, 350, 357, 365, 366

(56) References Cited

U.S. PATENT DOCUMENTS

| | | | | |
|---|---|---|---|---|
| 4,851,362 A | * | 7/1989 | Suzuki | 437/31 |
| 5,017,503 A | * | 5/1991 | Shiba | 437/31 |
| 6,060,365 A | * | 5/2000 | Kim | 438/357 |

* cited by examiner

*Primary Examiner*—Tom Thomas
*Assistant Examiner*—Donghee Kang
(74) *Attorney, Agent, or Firm*—Birch, Stewart, Kolasch & Birch, LLP

(57) ABSTRACT

A semiconductor device includes a semiconductor substrate, an insulating film having one portion below a surface of the semiconductor substrate and the other portion on the semiconductor substrate in a second region to the same thickness as the insulating film, which improves an operation speed even at a low voltage.

14 Claims, 9 Drawing Sheets

US 6,489,212 B1

SEMICONDUCTOR DEVICE AND METHOD FOR FABRICATING THE SAME

BACKGROUND OF THE INVENTION

1. Field of the Invention

The present invention relates to a semiconductor device, and more particularly, to a semiconductor device suitable for fast operation, and a method for fabricating the same.

2. Background of the Related Art

In general, a high speed operation of a device is most important for a high frequency semiconductor circuit. Higher operating speeds are possible as device size is reduced. But there are operational problems associated with reduced device size. To solve this, a related art suppresses a junction capacitance between a base and a collector using selective epitaxial layer growth and a floating poly base, plus a thick insulating film is provided on a bottom of the floating poly base for reduction of a parasitic capacitance.

A related art method for fabricating a semiconductor device will be explained with reference to the attached drawings. FIGS. 1A~1I illustrate sections showing the steps of a related art method for fabricating a semiconductor device.

Referring to FIG. 1A, the related art method for fabricating a semiconductor device starts with selective implantation, and drive diffusing, of $N^+$ impurity ions into an entire surface of a P type semiconductor substrate 11, to form a heavily doped N type well region 12 in the surface of the semiconductor substrate 11. A CVD (Chemical Vapor Deposition) oxide film 13 is formed on an entire surface of the semiconductor substrate 11 inclusive of the heavily doped N type well region 12. A first polysilicon layer 14 is deposited on the CVD oxide film 13 for use as a floating base, and subjected to pattering by photolithography and etching. As shown in FIG. 1B, a first insulating film 15 is formed on an entire surface of the semiconductor substrate 11 inclusive of the first polysilicon layer 14. Then, the first insulating film 15, the first polysilicon layer 14 and the CVD oxide film 13 are selectively removed to form a hole 27 that exposes a portion of the N type well region 12. The remaining CVD oxide film 13 is used for isolation of devices, and surfaces of the N type well region 12 on both sides of the CVD oxide film 13 at a center portion thereof are exposed.

As shown in FIG. 1C, a second insulating film is formed in the contact hole 27 and subjected to etch back to form second insulating sidewalls 16 at edges of the first insulating film 15, the first polysilicon layer 14, and the CVD oxide film 13. The exposed semiconductor substrate 11 is used as seeds in making an epitaxial growth to form a lightly doped n type first epitaxial layer 17 on the surface of the semiconductor substrate 11. The epitaxial growth using the semiconductor substrate as seeds changes the surface of the semiconductor substrate into a projected form, with a lightly doped n type epitaxial layer 17 grown on the surface.

As shown in FIG. 1D, the second insulating film sidewalls 16 at edges of the first insulating film 15 and the first polysilicon layer 14 are selectively removed. As shown in FIG. 1E, the first polysilicon layer 14 and the first epitaxial layer 17 are used as seeds in making an epitaxial growth of the semiconductor substrate 11 in vertical and horizontal directions, to grow a P type second epitaxial layer 18.

As shown in FIG. 1F, impurity ions are selectively implanted into the second epitaxial layer 18, to form a P type base region 19 and an $N^+$ collector contact region 20, respectively. Then, a thermal oxidation is conducted, to form a third insulating film 21 on surfaces of the P type base region 19 and the $N^+$ collector contact region 20.

As shown in FIG. 1G, a fourth insulating film is formed on the exposed surfaces of the structure of FIG. 1F, and etched back to form fourth insulating film sidewalls 22 at both edges of the first insulating film 15 while exposing a portion of the underlying base region 19. In this instance, the fourth insulating film is overetched to expose the surface of the base region 19 by also selectively removing a portion of the third insulating film 21 formed on a surface of the base region 19. The fourth insulating film sidewalls 22 are used to form an emitter in the base region 19 in a self-aligned manner, as follows.

As shown in FIG. 1H, the fourth insulating film sidewalls 22 and the first insulating film 15 are used as masks to self-align the implementation of $N^+$ impurity ions, and so form an $N^+$ emitter region 23 in a surface of the base region 19, i.e., a first intermediate structure. Then, a second polysilicon layer 24 is deposited on the exposed surfaces of the first intermediate structure, and subjected to photolithography and etching to selectively leave the second polysilicon layer 24 only on the emitter region 23, the N+ collector region 20 and the first insulating film 15 adjacent thereto. As shown in FIG. 1I, a general metal wiring is formed on the intermediate structure of FIG. 1H, to form metal wiring 25 on the semiconductor substrate 11, thereby completing the related art fabrication process. The metal wiring 25 is formed to connect the second polysilicon layer 24 to the first polysilicon layer 14.

However, the related art method for fabricating a semiconductor device has a problem in that the thick oxide film 13 on the bottom of the floating poly base 14 results in the thick N-epitaxial layer 17 (over 1 $\mu$m) that affects the maximum speed that the device can operate. That is, the excessively thick N-epitaxial layer 17 deteriorates the maximum speed of operation under low voltage conditions.

SUMMARY OF THE INVENTION

Accordingly, the present invention is directed to a semiconductor device and a method for fabricating the same that substantially obviates one or more of the problems due to limitations and disadvantages of the related art.

An object of the present invention is to provide a semiconductor device and a method for fabricating the same, which operates well operative at a high speed.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present to invention, as embodied and broadly described, a semiconductor device is provided that includes a semiconductor substrate, an insulating film formed discontinuously on the semiconductor substrate so as to leave at least one gap where the semiconductor substrate is exposed, the insulating film having first portions below a surface of the semiconductor substrate and second portions above the surface of the semiconductor substrate, respectively, and a semiconductor layer formed on the semiconductor substrate at one of the at least one gap in said insulation film, a height of said semiconductor layer being equal to a height of the insulating film.

In other aspect of the present invention, there is provided a method for fabricating a semiconductor device. Such a method comprises oxidizing a substrate to form an insulating film having at least one gap where the substrate is exposed, and forming a semiconductor layer on the substrate at one of the at least one gap in the insulating film, a height of the semiconductor layer being equal to a height of the insulating film.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1A:
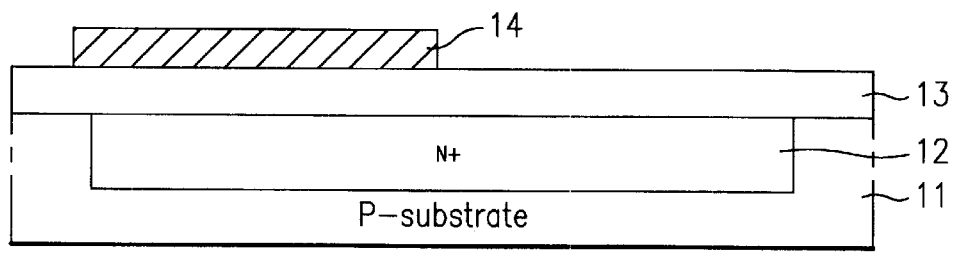
FIGS. 1A~1I illustrate sections showing the steps of a related art method for fabricating a semiconductor device.
Figure 1B:
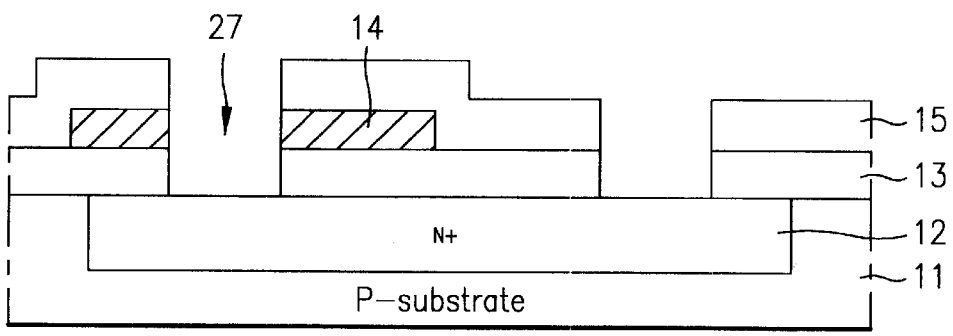
Figure 1C:
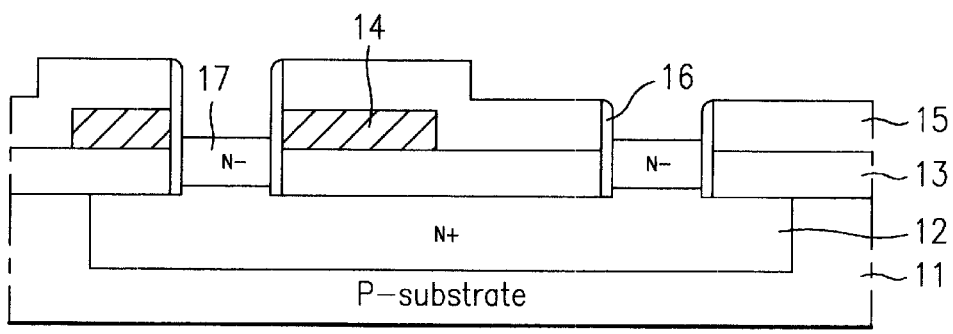
Figure 1D:
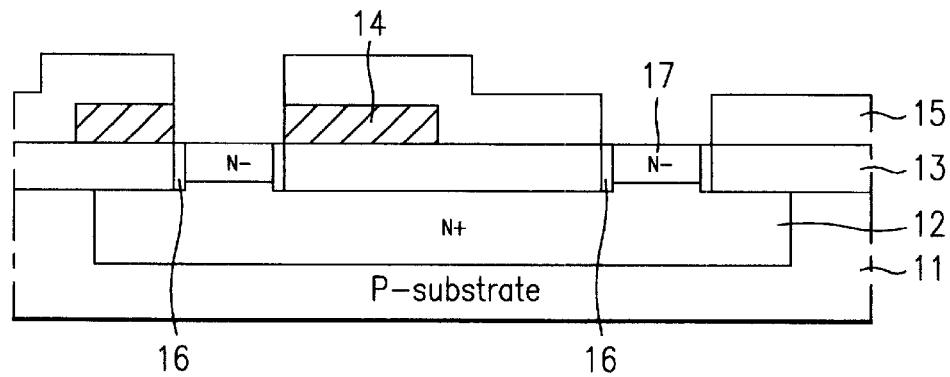
Figure 1E:
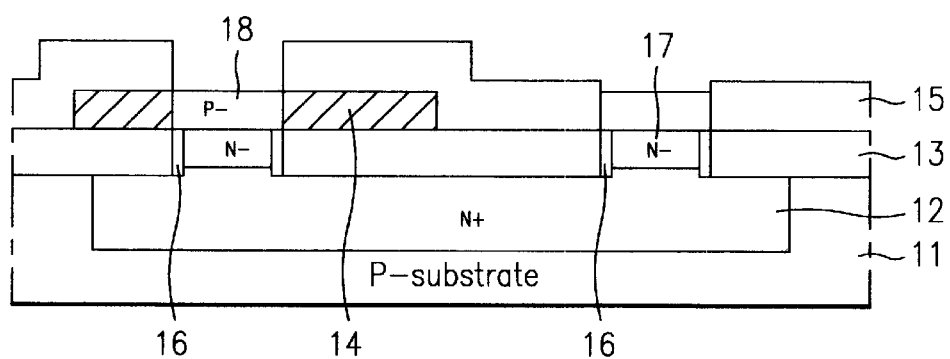
Figure 1F:
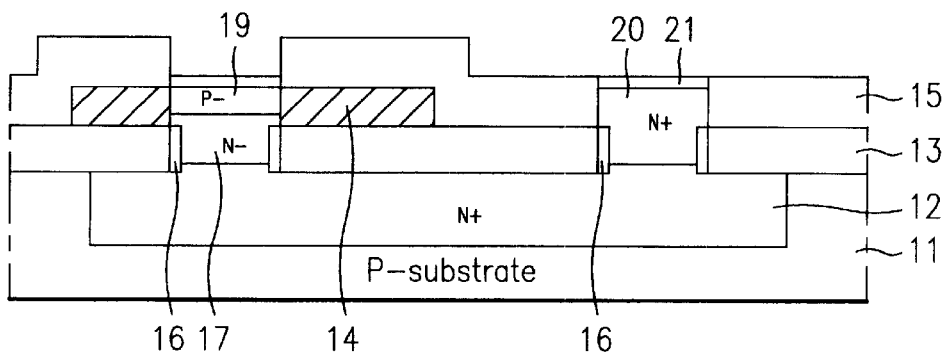
Figure 1G:
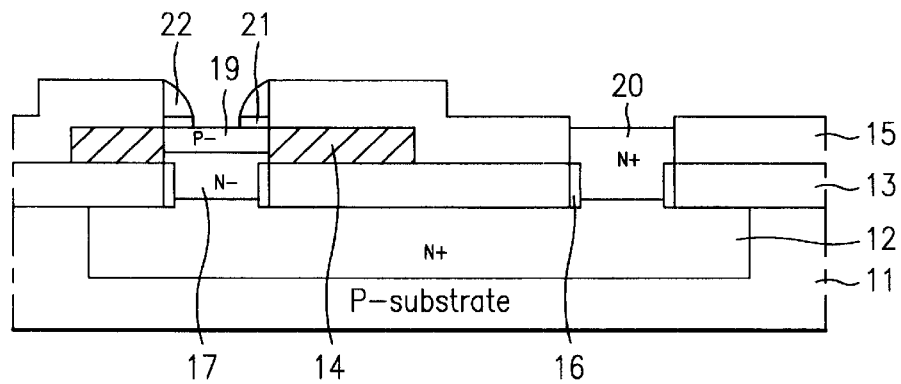
Figure 1H:
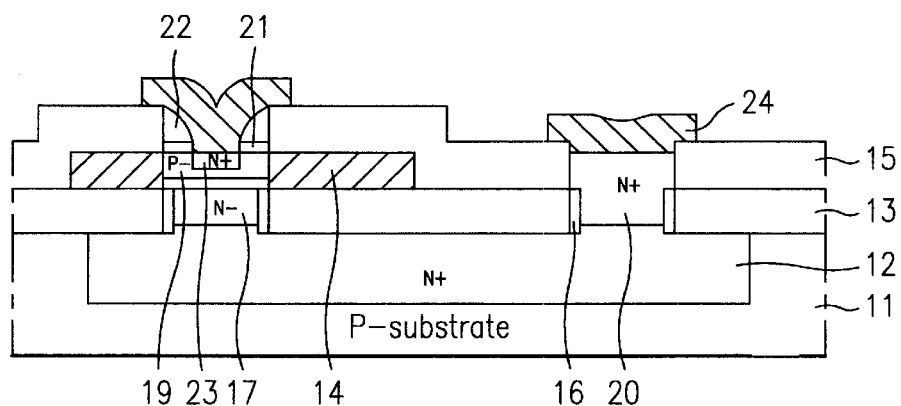
Figure 1I:
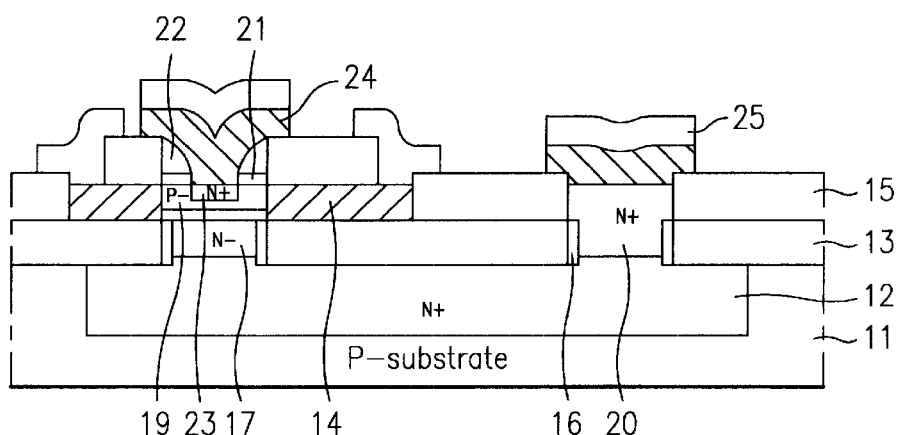
Figure 2:
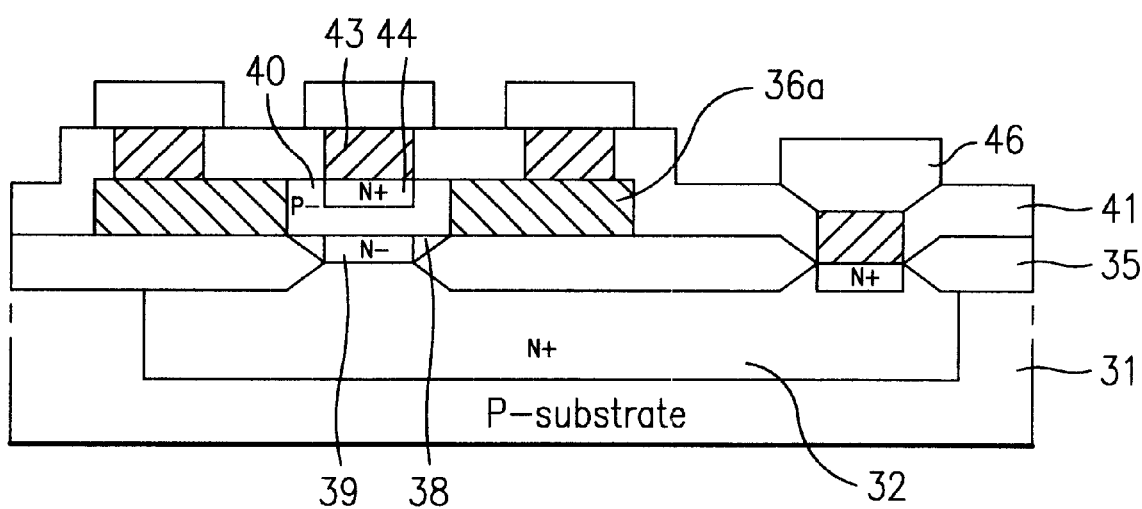
FIG. 2 illustrates a section of a semiconductor device in accordance with a preferred embodiment of the present invention.

Reference will now be made in detail to the preferred embodiments of the present invention, examples of which are illustrated in the accompanying drawings. FIG. 2 illustrates a section of a semiconductor device in accordance with a preferred embodiment of the present invention.

Referring to FIG. 2, in the semiconductor device in accordance with a preferred embodiment of the present invention, there are a heavily doped N type (N+) type well region 32 formed at a surface of a P type semiconductor substrate 31, a thermal oxidation film 35 having one portion below a surface of the semiconductor substrate 31 and the other portion above the surface of the semiconductor substrate 31, and an N-epitaxial layer 39 formed at the surface of the semiconductor substrate 31. There are second insulating film sidewalls 38 between the N-epitaxial layer 39 and the thermal oxidation film 35, a P-epitaxial layer 40 formed on the second insulating film sidewalls 38 and the N-epitaxial layer 39, and a first polysilicon pattern 36a formed on the thermal oxidation film 35 on both sides of the P-epitaxial layer 40. And, there are an emitter region 44 in a surface of the P-epitaxial layer 40, a third insulating film 41 having contact holes formed therein of prefereably identical widths so as to expose portions of the first polysilicon pattern 36a and the P-epitaxial layer 40, a second polysilicon layer 43 formed in the contact holes to preferably the same thickness as the third insulating film 41, and a metal wiring 46 formed on the second polysilicon layer 43 and the third insulating film 41 adjacent thereto.

Figure 3A:
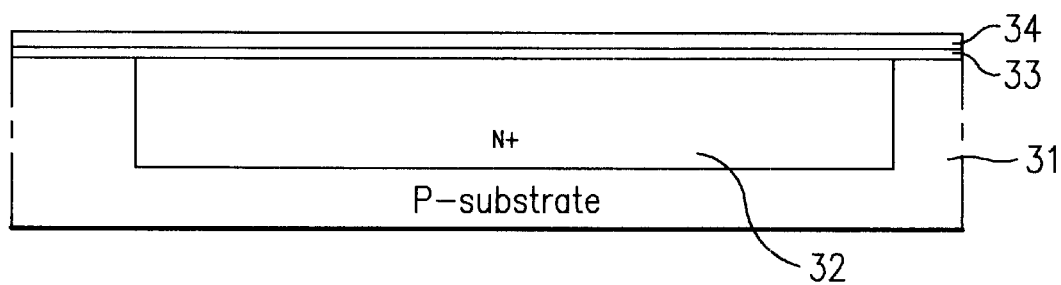
FIGS. 3A~3N illustrate sections showing the steps of a method for fabricating a semiconductor device in accordance with a preferred embodiment of the present invention.
Figure 3B:
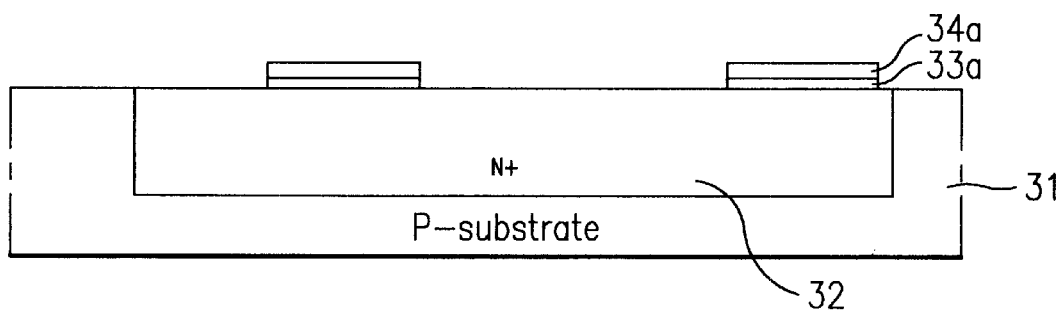
Figure 3C:
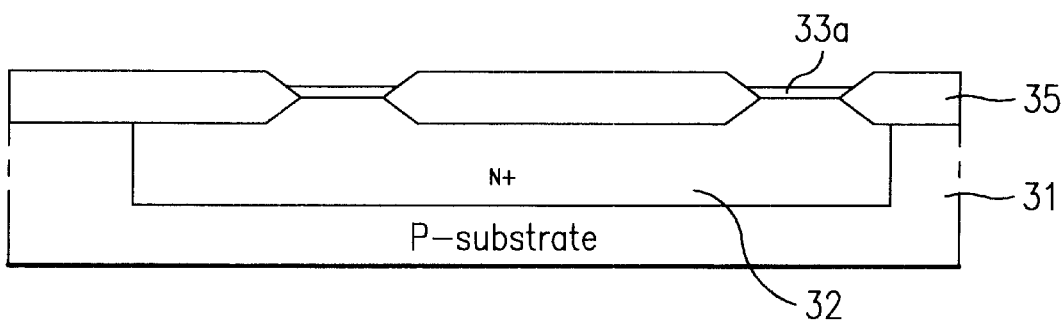
Figure 3D:
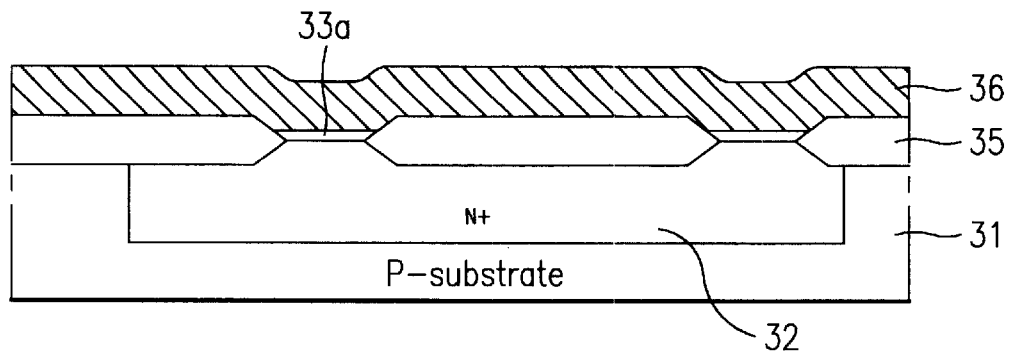
Figure 3E:
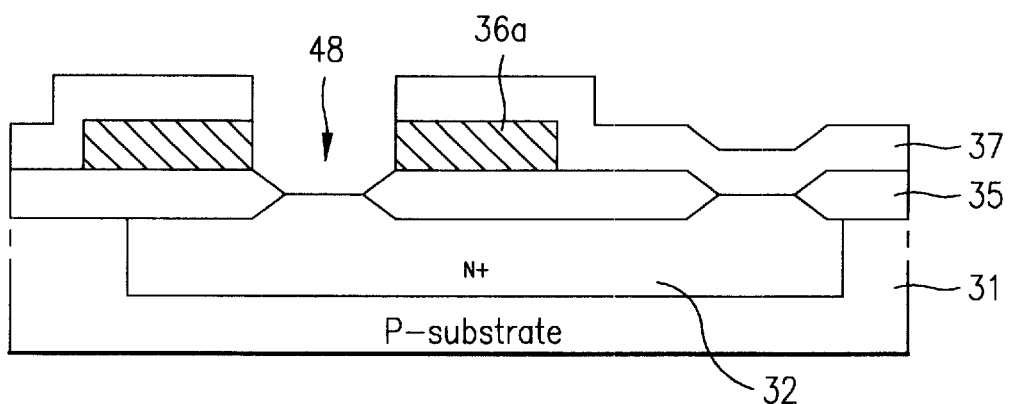
Figure 3F:
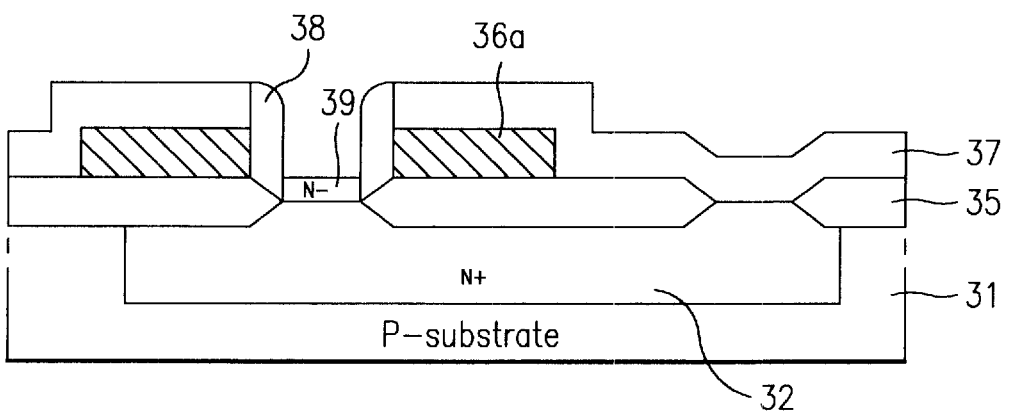
Figure 3G:
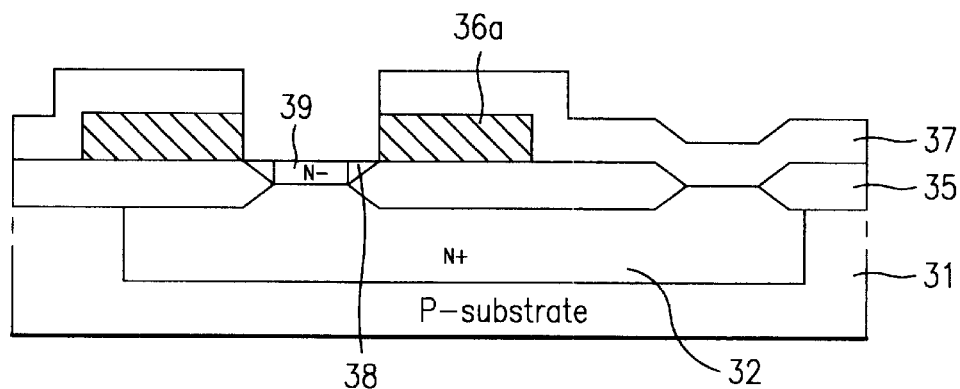
Figure 3H:
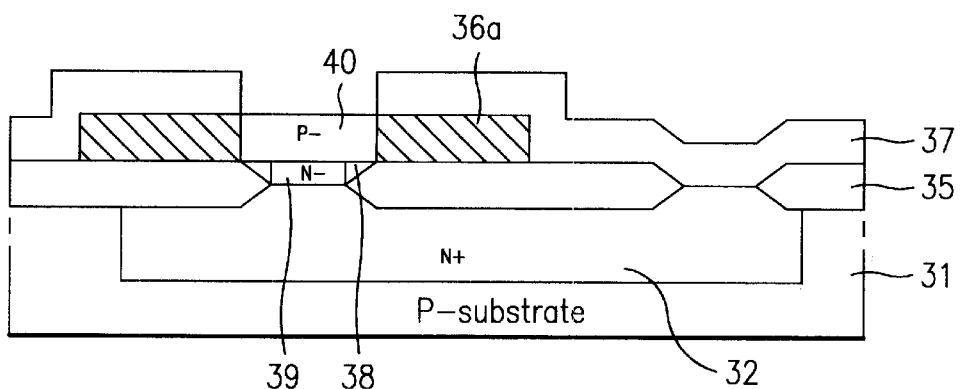
Figure 3I:
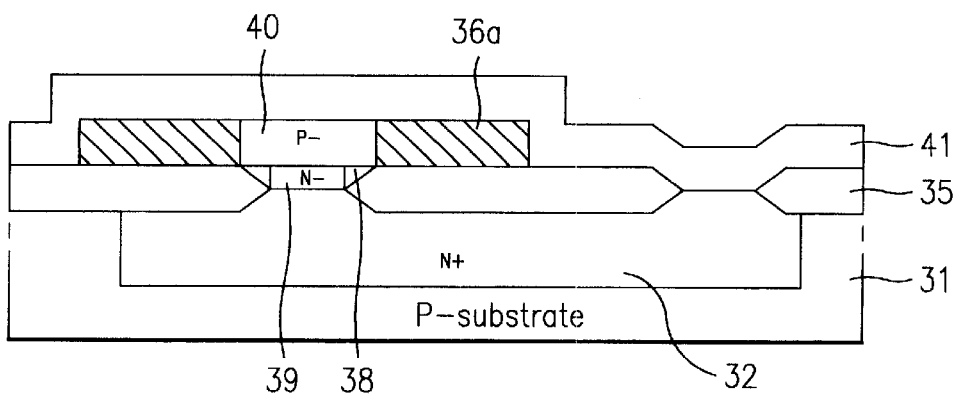
Figure 3J:
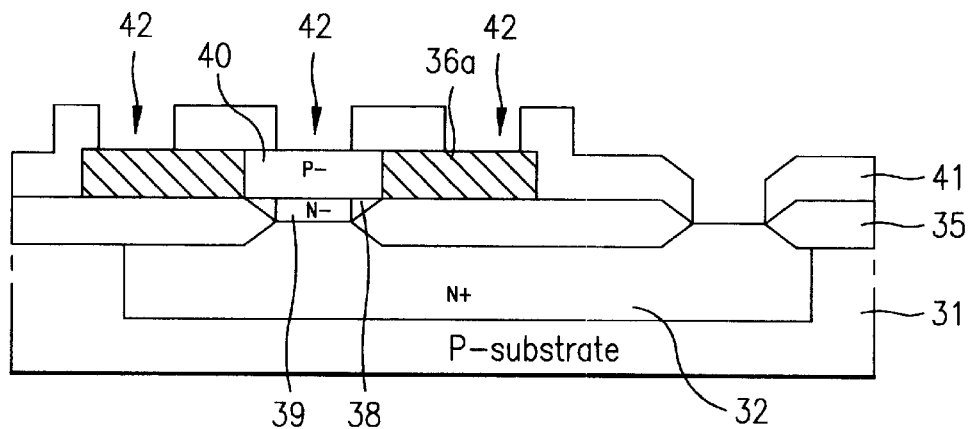
Figure 3K:
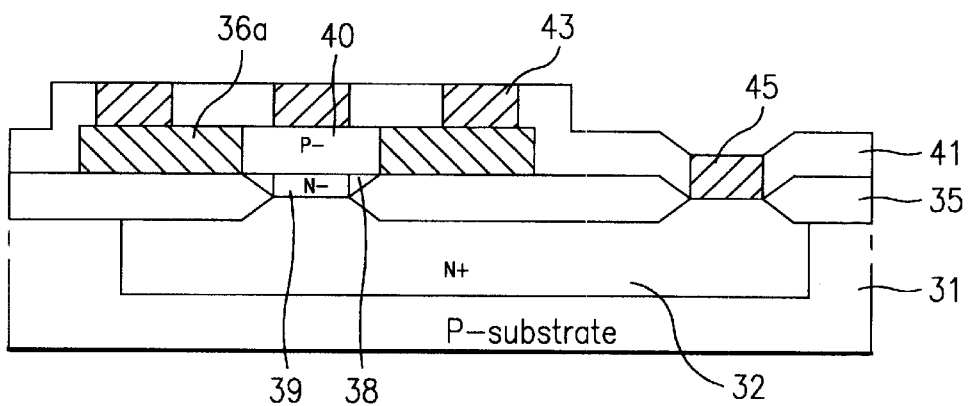
Figure 3L:
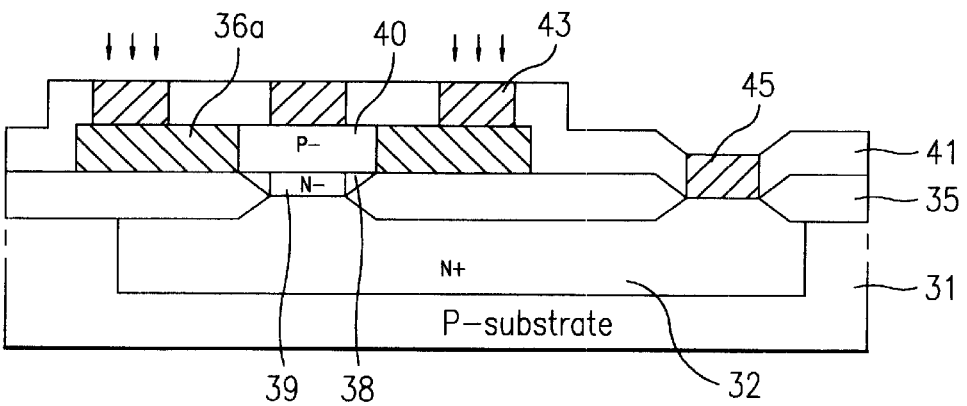
Figure 3M:
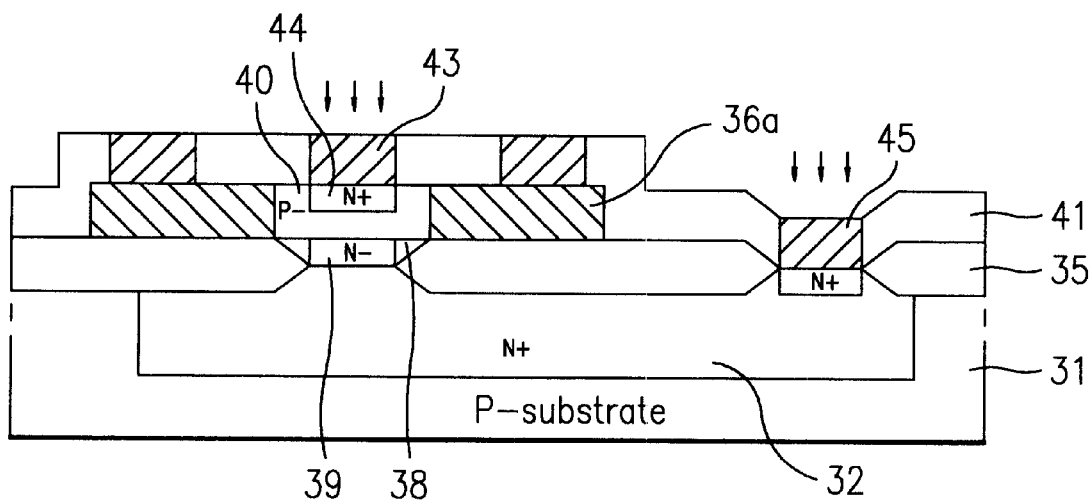
Figure 3N:
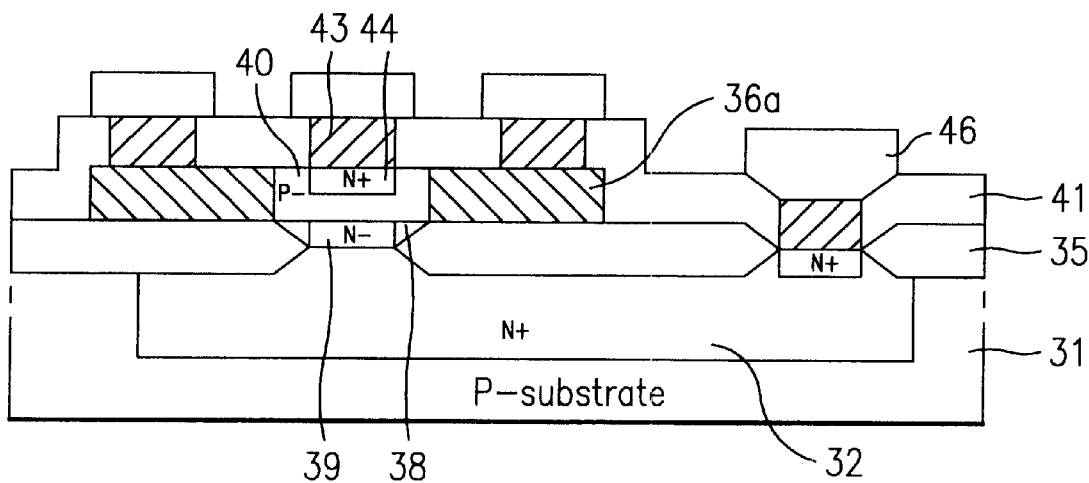

FIGS. 3A~3N illustrate sections showing the steps of a method for fabricating a semiconductor device in accordance with a preferred embodiment of the present invention.

Referring to FIG. 3A, the method for fabricating a semiconductor device in accordance with a preferred embodiment of the present invention starts with selectively and heavily implanting N+ type impurity ions into a region of a P type semiconductor substrate 31, to form an N type well region 32 at the surface of the semiconductor substrate 31. And, a buffer oxide film 33 and a nitride film 34 are formed on an entire surface of the semiconductor substrate 31 inclusive of the N type well region 32 in succession. The buffer oxide film 33 is formed to a thickness, e.g., of a few hundred Å, and the nitride film 34 is formed to a thickness, e.g., of about 1000~2000 Å.

As shown in FIG. 3B, the nitride film 34 and the buffer oxide film 33 are subjected to patterning by photolithography and etching, to form a nitride film pattern 34A and a buffer oxide film pattern 33A. The nitride film pattern 34A and the buffer oxide film pattern 33A are formed on the N type well spaced from each other.

As shown in FIG. 3C, the nitride film pattern 34A and the buffer oxide film pattern 33A are used as masks in subjecting the semiconductor substrate 31 to a selective oxidation, to form a thermal oxidation film 35, e.g., of about 1.0 μm thickness on an exposed surface of the semiconductor substrate 31. The thermal oxidation film 35 is used as an insulating film of the floating poly base and an N type well region 32 to be formed later. Then, the nitride film pattern 34A is selectively removed.

As shown in FIG. 3D, a first polysilicon layer 36 is deposited on an entire surface of the semiconductor substrate 31 for use as the floating poly base. The first polysilicon layer 36 is formed of polysilicon doped with P type impurity ions. The buffer oxide film pattern 33A is used as an etch step to protect the N+ well region 32 of the semiconductor substrate 31 when the first polysilicon layer 36 is selectively etched.

As shown in FIG. 3E, the first polysilicon layer 36 is selectively removed to form a first polysilicon pattern (or floating poly base) 36a. In this instance, the first polysilicon layer 36 is overetched in the selective removal of the first polysilicon layer 36, to remove the buffer oxide film pattern 33A at the same time. Then, a first insulating film 37 is formed on an entire surface of the semiconductor substrate 31 inclusive of the first polysilicon pattern 36a, and subjected to selective removal by photolithography and etching to form a contact hole 48 that exposes a portion of the N type well region 32. In contrast to the related art, only one side of the thermal oxidation film 35 formed at a center of the N type well region 32 is preferably exposed in exposing a portion of the surface of the N type well region 32.

As shown in FIG. 3F, a second insulating film is formed on the intermediate structure depicted in FIG. 3E and etched back, to form second insulating film sidewalls 38 at both edges of the first insulating film 37, the first polysilicon pattern 36a, and the thermal oxidation film 35. Then, the exposed N+ well region 32 of the semiconductor substrate 31 is used as a seed in making an epitaxial growth, to form a lightly doped n-type first epitaxial layer 39 on a surface of the N type well region 32 of the semiconductor substrate 31. The first epitaxial layer 39 is preferably grown to the same height as the thermal oxidation film 35.

As shown in FIG. 3G, the second insulating film sidewalls 38 formed at both edges of the first insulating film 37 and the first polysilicon pattern 36a is selectively removed. The second insulating film sidewalls 38 at both edges of the thermal oxidation film 35 are left intact.

As shown in FIG. 3H, the first polysilicon pattern 36a and the N type first epitaxial layer 39 are used as seeds in making a second epitaxial growth in vertical and horizontal directions, i.e., to grow a P type second epitaxial layer 40 on the first epitaxial layer 39. The second epitaxial layer 40 is preferably formed to the same height as the first polysilicon pattern 36a.

As shown in FIG. 3I, the first insulating film 37 is removed to form a second intermediate structure. Then, a third insulating film 41 is formed on an entire surface of the second intermediate structure. As shown in FIG. 3J, the third insulating film 41 is removed selectively, to expose portions of the first polysilicon pattern 36a, the second epitaxial layer 40 and the N type well region 32, which forms contact holes 42 of preferably the same size. As shown in FIG. 3K, a second polysilicon layer 43 is deposited on an entire surface of the intermediate structure depicted in FIG. J inclusive of the contact holes 42, and planarized by etch back or CMP (Chemical Mechanical Polishing), to leave the second polysilicon layer 43 only in the contact holes 42. The second polysilicon layer 43 is formed of an undoped polysilicon.

As shown in FIG. 3L, p type impurity ions are selectively and heavily implanted only into the second polysilicon layer 43 on the second epitaxial layer 40, to form a base contact region. As shown in FIG. 3M, n type impurity ions are implanted into the second polysilicon layer 43 over the second epitaxial layer 40 and the N type well region 32, to form an emitter region 44 (in a surface of the second epitaxial layer 40) and a collector contact region 45 in a surface of the N type well region 32. The second polysilicon layer 43 in the contact holes 42 serve as contact plugs metal wiring to be formed later. As shown in FIG. 3N, a metal layer is deposited on an entire surface of the intermediate structure depicted in FIG. 3M, and selectively removed, to form a metal wiring 46 on the second polysilicon layer 43 and the third insulating film 41 adjacent thereto.

As has been explained, a method for fabricating a bipolar transistor of the present invention has the following advantages.

First, the formation of the N-epitaxial layer 39 to the same height as the insulating film 35 under the floating base conduction layer 36a improves an operation speed even at a low voltage.

Second, the plugs 43 formed in the contact holes 42 improve step coverage of the metal wiring without any additional process steps.

It will be apparent to those skilled in the art that various modifications and variations can be made in the semiconductor device and the method for fabricating the same of the present invention without departing from the spirit or scope of the invention. Thus, it is intended that the present invention cover the modifications and variations of this invention provided they come within the scope of the appended claims and their equivalents.

What is claimed is:

1. A method for fabricating a semiconductor device, the method comprising:

providing a first conduction type substrate;

forming a second conduction type well at a surface of the first conduction type substrate;

forming mask pattern layer on at least one region of the substrate;

using the mask pattern layer in selectively oxidizing the substrate to form a first insulating film having at least one gap corresponding to the mask pattern layer;

forming a conductive layer on the mask pattern layer and the first insulating film;

forming a second insulating film on an entire surface of the substrate inclusive of the conductive layer;

selectively removing the second insulating film, the conductive layer and the mask pattern layer to form a contact hole that exposes the well in the substrate;

forming third insulating film sidewalls against both edges of the second insulating film, the conductive layer and the first insulating film in the contact hole; and forming a first semiconductor layer of a first conductive type in the contact hole on the well in the substrate to the same height as the first insulating film.

2. The method as claimed in claim 1, further comprising:

selectively removing portions of the third insulating film sidewalls such that said sidewalls remain only at both edges of the first semiconductor layer; and forming a second semiconductor layer of a first conduction type on the remaining third insulating film sidewalls and the first semiconductor layer.

3. The method as claimed in claim 2, further comprising:

removing the second insulating film to produce an intermediate structure and forming a fourth insulating film on the intermediate structure;

selectively removing the fourth insulating film to expose portions of the conductive layer and the second semiconductor layer so as to form contact holes;

forming plugs in the contact holes; and forming an emitter region in a surface of the second semiconductor layer.

4. The method as claimed in claim 3, wherein the fourth insulating film is chemical vapor deposited.

5. The method as claimed in claim 1, wherein the mask pattern layer includes a stack of an oxide film and a nitride film.

6. The method as claimed in claim 1, wherein the conductive layer is formed of polysilicon doped with impurity ions of the first conduction type.

7. The method as claimed in claim 1, wherein the second insulating film is chemical vapor deposited.

8. The method as claimed in claim 1, wherein the first conduction type is p type, and the second conduction type is n type.

9. The method as claimed in claim 3, wherein all the contact holes have the same widths.

10. The method as claimed in claim 3, wherein the plugs are formed by depositing a polysilicon layer on the fourth insulating layer and in the contact holes, and then planarizing by etch back or CMP.

11. The method as claimed in claim 2, wherein the second semiconductor layer is formed to the same height as the conductive layer.

12. The method as claimed in claim 5, wherein the oxide film has a thickness of a few hundred Å, and the nitride film has a thickness of about 1000~2000Å.

13. The method as claimed in claim 1, wherein the second insulating film has a thickness of about 1.0 $\mu$m.

14. The method as claimed in claim 3, wherein the plug is formed of undoped polysilicon.

* * * * *